(12) United States Patent
Heydari et al.

(10) Patent No.: US 7,675,163 B2
(45) Date of Patent: Mar. 9, 2010

(54) CARBON NANOTUBES FOR ACTIVE DIRECT AND INDIRECT COOLING OF ELECTRONICS DEVICE

(75) Inventors: Ali Heydari, Albany, CA (US); Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 369 days.

(21) Appl. No.: 11/726,302

(22) Filed: Mar. 21, 2007

(65) Prior Publication Data
US 2008/0230894 A1   Sep. 25, 2008

(51) Int. Cl.
*H01L 23/12*   (2006.01)
(52) U.S. Cl. ............... 257/704; 257/714; 257/E23.193
(58) Field of Classification Search .......... 257/704, 257/710, 714, 716, E23.193
See application file for complete search history.

(56) References Cited
U.S. PATENT DOCUMENTS

| 6,766,817 | B2 | 7/2004 | da Silva et al. |
| 6,918,404 | B2 | 7/2005 | Dias da Silva et al. |
| 7,066,586 | B2 | 6/2006 | da Silva et al. |
| 2007/0235847 | A1* | 10/2007 | Ramanathan et al. ....... 257/678 |

* cited by examiner

*Primary Examiner*—Hoai v Pham
(74) *Attorney, Agent, or Firm*—Osha • Liang LLP

(57) ABSTRACT

A system for cooling a semiconductor device is disclosed. The system includes a lid encasing the semiconductor device, a first plurality of carbon nanotubes disposed within the lid, and a fluid system configured to pass a fluid through the lid. Furthermore, a second system for cooling a semiconductor device is disclosed. The second system includes a lid, a first plurality of carbon nanotubes disposed within the lid, and a fluid system configured to pass a fluid through the lid. The lid is configured to be mounted over and encase the semiconductor device. Additionally, a method for cooling a semiconductor device is disclosed. The method includes disposing a first plurality of carbon nanotubes within a lid, mounting the lid over the semiconductor device, and passing a fluid through the lid.

24 Claims, 4 Drawing Sheets

CARBON NANOTUBES FOR ACTIVE DIRECT AND INDIRECT COOLING OF ELECTRONICS DEVICE

BACKGROUND

1. Technical Field

Embodiments of the present invention generally relate to systems and methods for cooling semiconductor devices.

2. Background Art

Computer cooling involves the removal of heat from computers and associated components, such as semiconductor devices. All semiconductor devices have some form of conduction resistance which leads to the generation of heat when these devices are operated. Heat flow begins at the semiconductor junction through which electric current travels. This heat is conducted from the device body onto the package that the semiconductor is housed in, and then to the air. This heat energy increases the temperature of the semiconductor. If heat is not dissipated from the semiconductor fast enough, the semiconductor temperature may increase beyond the specified operating temperature, resulting in shorter component life spans as well as problems such as computer system freezes or crashes.

The current approach for cooling a semiconductor device involves conducting heat away from the semiconductor device. FIG. 1 shows a typical cooling system 10 for cooling a semiconductor device 12. The semiconductor device 12 is mounted onto a substrate 14 and sandwiched between the substrate 14 and a first thermal interface material (TIM) layer 16. A lid 18 encases the semiconductor device to provide structural rigidity and protection from external elements. A second TIM layer 20, which may be an adhesive material bonding the lid 18 to a heat sink 22, is disposed on a top surface of the lid 18. The heat sink 22 is mounted onto the second TIM layer 20, and has a plurality of fins and a large surface area to facilitate heat transfer to surrounding air. As heat is dissipated from the semiconductor device 12, the first and second TIM layers 16, 20 and the lid 18, which are constructed of materials chosen for high thermal conductivity, transfer the heat to the heat sink. Heat is then transferred from the heat sink 22 to the surrounding air.

The removal of heat from a semiconductor device is dependent on numerous factors. For example, the thermal conductivity of the materials used to construct a cooling system (e.g., the lid, heat sink, and TIM layers) have a direct effect on the ability of the cooling system to transfer heat to the surrounding air.

SUMMARY

In one aspect, the invention relates to a system for cooling a semiconductor device, including a lid encasing the semiconductor device, a first plurality of carbon nanotubes disposed within the lid, and a fluid system configured to pass a fluid through the lid.

In another aspect, the invention relates to a system for cooling a semiconductor device, including a lid, a first plurality of carbon nanotubes disposed within the lid, and a fluid system configured to pass a fluid through the lid. Furthermore, the lid is configured to be mounted over and encase the semiconductor device.

In another aspect, the invention relates to a method for cooling a semiconductor device, including disposing a first plurality of carbon nanotubes within a lid, mounting the lid over the semiconductor device, and passing a fluid through the lid.

Other aspects of the invention will be apparent from the following description and the appended claims.

DETAILED DESCRIPTION

Figure 1:
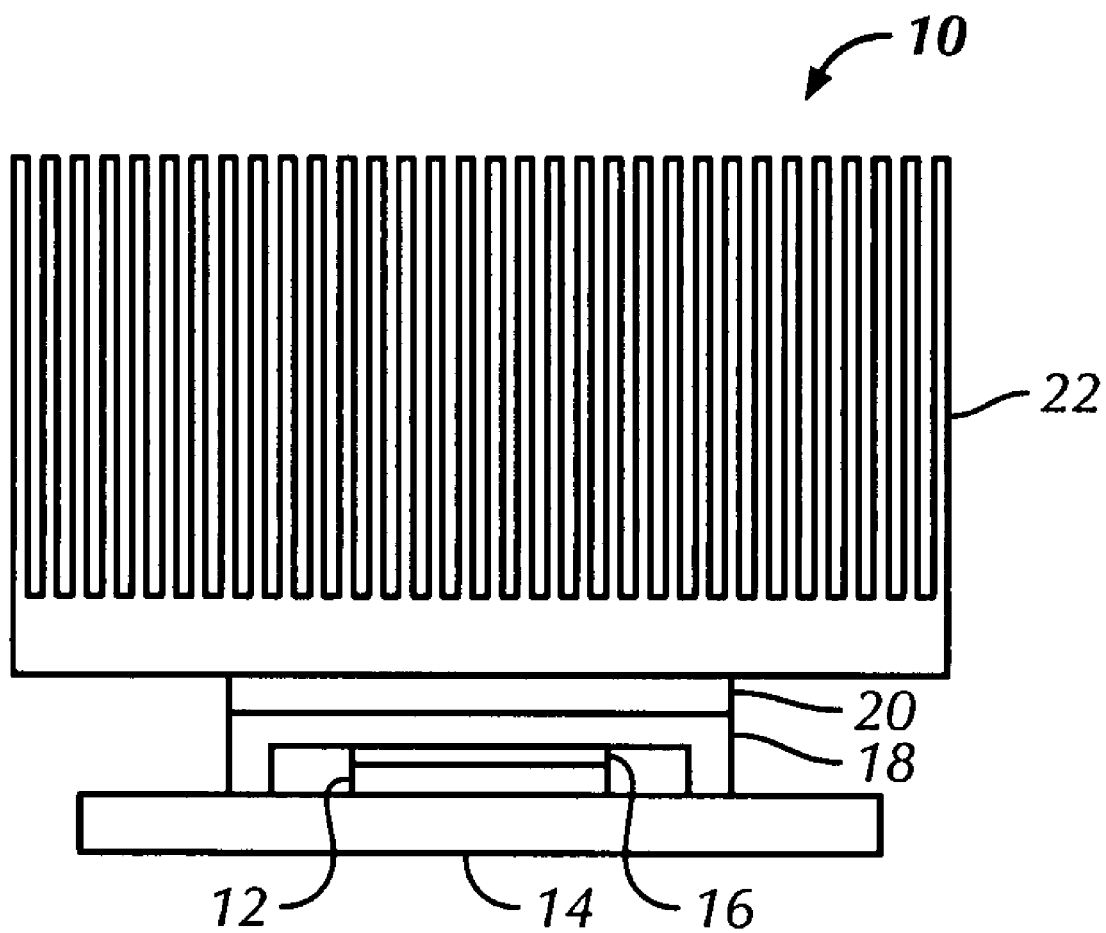
FIG. 1 shows a side view of a prior art cooling system.

Specific embodiments of the present invention will now be described in detail with reference to the accompanying figures. Like elements in the various figures may be denoted by like reference numerals for consistency.

In the following detailed description of embodiments of the present invention, numerous specific details are set forth in order to provide a more thorough understanding of the invention. However, it will be apparent to one of ordinary skill in the art that the present invention may be practiced without these specific details. In other instances, well-known features have not been described in detail to avoid unnecessarily complicating the description.

In general, embodiments of the present invention relate to systems and methods for cooling a semiconductor device. Specifically, one or more embodiments include a lid for a semiconductor device, wherein a plurality of carbon nanotubes are disposed in the lid. Furthermore, carbon nanotubes disposed in the lid may directly contact a semiconductor device, thus directly conducting heat way from the semiconductor device. Alternatively, the carbon nanotubes may indirectly conduct heat from the semiconductor device. Additionally, embodiments of the present invention may actively cool a semiconductor device by passing a fluid through a lid for direct or indirect cooling of the semiconductor device.

Figure 2:
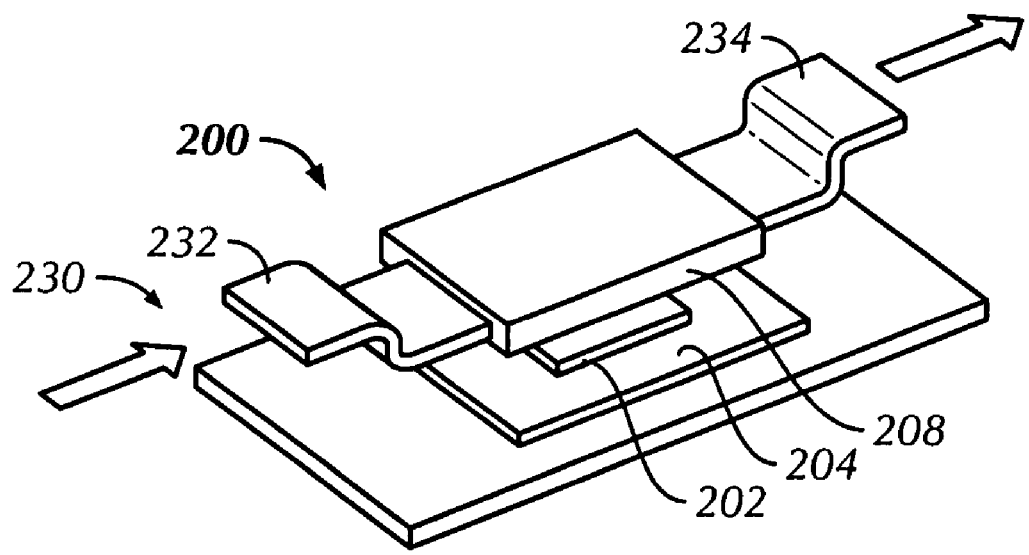
FIG. 2 shows a perspective view of a cooling system in accordance with one or more embodiments of the present invention.

FIG. 2 shows a cooling system 200 for cooling a semiconductor device 202 in accordance with one or more embodiments of the present invention. The semiconductor device 202 is mounted on a substrate 204. The cooling system 200 further includes a lid 208 configured to be mounted over and encase the semiconductor device 202. The lid 208 may provide structural rigidity and protection from external elements for the semiconductor device 202. The semiconductor device 202 may be any device that generates heat, and, thus, requires cooling. For example, the semiconductor device 202 may be a microprocessor, a central processing unit, a graphics processing unit, etc. Also, more than one semiconductor device may be mounted on the substrate 204 and cooled by the cooling system 200.

In embodiments of the present invention, a plurality of carbon nanotubes are disposed within the lid (not shown). Carbon nanotubes have a very high thermal conductivity relative to other known materials. Additionally, carbon nanotubes provide mechanical rigidity and geometrical flexibility, which may not typically be provided by materials currently used in cooling systems. Thus, carbon nanotubes are able to conduct heat away from the semiconductor device 202 in a desired manner.

Additionally, the cooling system 200 includes a fluid system 230 configured to pass a fluid through the lid 208. The fluid system 230 provides an active mechanism by which heat may be removed from the semiconductor device 202. For example, in one or more embodiments, the fluid system 230 may include a first pipe 232 and a second pipe 234, wherein the first and second pipes 232, 234 are connected to and communicate with the lid 208. However, those skilled in the art will recognize that any fluid system configured to pass a fluid through the lid may be utilized. Additionally, the fluid system 230 may include a pump configured to facilitate the flow of the fluid through the lid, and those skilled in the art will recognize that many other mechanisms may be employed for this purpose.

In the embodiment shown in FIG. 2, a fluid enters through the first pipe 232 into the lid 208. The fluid then passes through the lid 208 and exits the lid 208 into the second pipe 234. Accordingly, the fluid entering the lid 208 absorbs heat from surfaces of the lid 208, the carbon nanotubes, and/or the semiconductor device 202, and then exits the lid 208, thereby removing heat from the semiconductor device 202. The fluid passed through the lid 208 may be any fluid available for use in this type of system, and, further, may be chosen for any given thermal application. For example, the fluid may be water, water-glycol, a dielectric material, refrigerants (e.g., R-134a, or any other compatible compression system refrigerant), or any other fluids known to those skilled in the art. Furthermore, many mechanisms of removing the heat from the fluid after the fluid exits the lid 208 will be appreciated by those skilled in the art.

In one or more embodiments, the carbon nanotubes disposed in the lid may be disposed or grown in any configuration, and, specifically, in any configuration maximizing the conduction of heat away from the semiconductor device 202 and/or maximizing release of the heat into the fluid. For example, the carbon nanotubes may be formed into microchannels, thereby creating a large surface area of the carbon nanotubes. The fluid may then enter the lid 208, flow through the carbon nanotube microchannels, and then exit the lid 208. Accordingly, a heat exchange surface area between the carbon nanotubes and the fluid is increased, thus increasing the removal of heat from the carbon nanotubes into the fluid.

Furthermore, the use of carbon nanotubes to form the microchannels allows for the microchannels to be formed in any geometrical configuration desired, such as straight channels or a lattice structure. Specifically, the width, length, shape, and location of the microchannels may be formed as desired with the use of carbon nanotubes. Accordingly, flow rate, contact time, and contact area of the fluid may be controlled.

The cooling system 200 includes an active cooling mechanism, i.e., the fluid system 230, by which heat may be removed. Accordingly, the cooling system 200 may not require the use of a heat sink structure, thus eliminating the need for components corresponding to a heat sink structure. This may allow for the cooling system 200 to be dimensionally smaller and more densely packed within, for example, a computer system. However, a heat sink structure in thermal contact with the lid 208 may also be included in the cooling system 200 for additional cooling. In such embodiments, a thermal interface material layer (i.e., a heat sink thermal interface material layer) may be disposed on a top surface of the lid 208. A heat sink, which is well known in the art, may then be mounted onto the thermal interface material layer.

Figure 3:
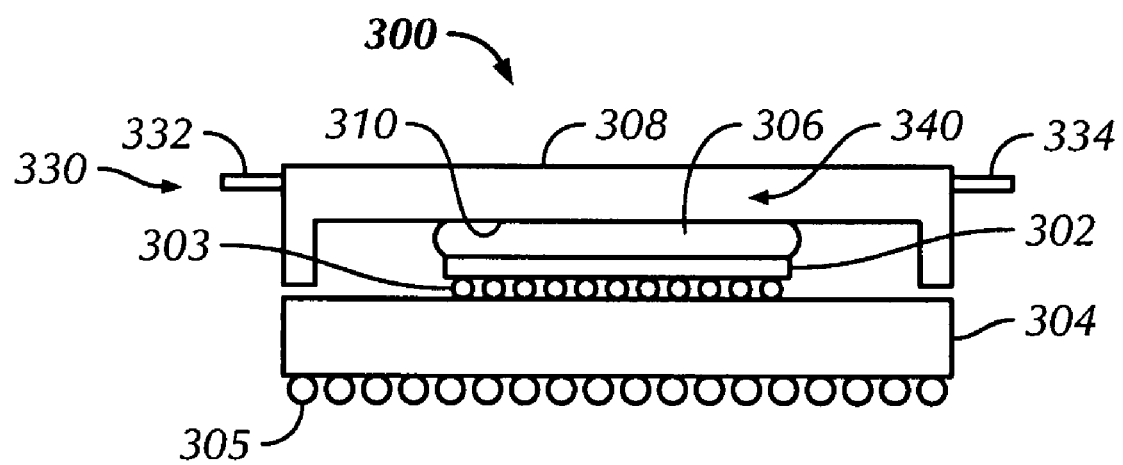
FIG. 3 shows a side view of an indirect cooling system in accordance with one or more embodiments of the present invention.

FIG. 3 shows a side view of an indirect cooling system 300 for cooling a semiconductor device 302 in accordance with one or more embodiments of the present invention. The indirect cooling system 300 is similar to the cooling system 200 shown in FIG. 2. The semiconductor device 302 is mounted onto a substrate 304. In the embodiment shown, the semiconductor device 302 is mounted to the substrate 304 by bumps 303. However, those skilled in the art will recognize that the semiconductor device 302 may be mounted to the substrate 304 in any other manner known in the art. Furthermore, the substrate 304 may be mounted to a printed circuit board (PCB) (not shown), or any other substrate, by ball grid array (BGA) 305. Even further, mounting the semiconductor device 302 to the substrate 304 may include electrically connecting the semiconductor device 302 to the substrate 304. Similarly, mounting the substrate 304 to the PCB may include electrically connecting the substrate 304 to the PCB.

A thermal interface material (TIM) layer 306 is disposed on a top surface of the semiconductor device 302, and a lid 308 is mounted over the TIM layer 306. The lid 308 effectively encases the semiconductor device 302 between the lid 308 and the substrate 304. Furthermore, the lid 308 is thermally coupled with the semiconductor device 302 via the TIM layer 306.

The lid 308 includes a chamber 340 in which a plurality of carbon nanotubes are disposed. As discussed above, the carbon nanotubes help to remove heat from the lid 308. Accordingly, the plurality of carbon nanotubes are indirectly coupled with the semiconductor device 302, and, thus, conduct heat away from the semiconductor device 302.

Additionally, the indirect cooling system 300 includes a fluid system 330 configured to pass a fluid through the lid 308, thereby employing an active mechanism by which heat may be removed. As shown in FIG. 3, the fluid system 330 includes a first pipe 332 and a second pipe 334, each connected to and communicating with the chamber 340 of the lid 308. Thus, the fluid system 330 is further configured to pass the fluid through the chamber 340 of the lid 308. As discussed above, those skilled in the art will appreciate that the fluid system 330 may employ any mechanism known in the art by which the fluid system 330 is configured to pass the fluid through the lid 308. Furthermore, the fluid system 330 may employ any mechanism known in the art to facilitate flow of the fluid through the lid 308. For example, a pump may be connected to either the first and second pipes 332, 334.

Figure 4:
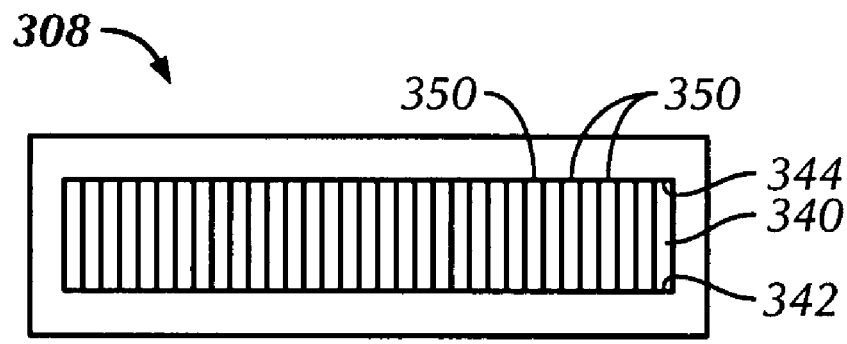
FIG. 4 shows an end view of a chamber of the indirect cooling system of FIG. 3.

FIG. 4 shows an end view of the chamber 340 of the lid 308 in accordance with one or more embodiments of the present invention, wherein the lid 308 is rotated ninety degrees from the lid 308 shown in FIG. 3. Here, the plurality of carbon nanotubes 350 are shown disposed in the chamber 340 of the lid 308. The chamber 340 includes a bottom surface 342 and a top surface 344. In this embodiment, the carbon nanotubes 350 are shown disposed between the bottom surface 342 and the top surface of the chamber 340 and formed in a plurality of microchannels. However, those skilled in the art will appreciate that the carbon nanotubes 350 may be disposed in the chamber 340 in any desired manner.

Accordingly, the fluid system 330 passes the fluid through the chamber 342, and, further, through the microchannels of the carbon nanotubes 350. Thus, the fluid removes heat from the carbon nanotubes 350 and the lid 308. Effectively, the carbon nanotubes 350, and the fluid passed therethrough, indirectly cool the semiconductor device 302.

Figure 5:
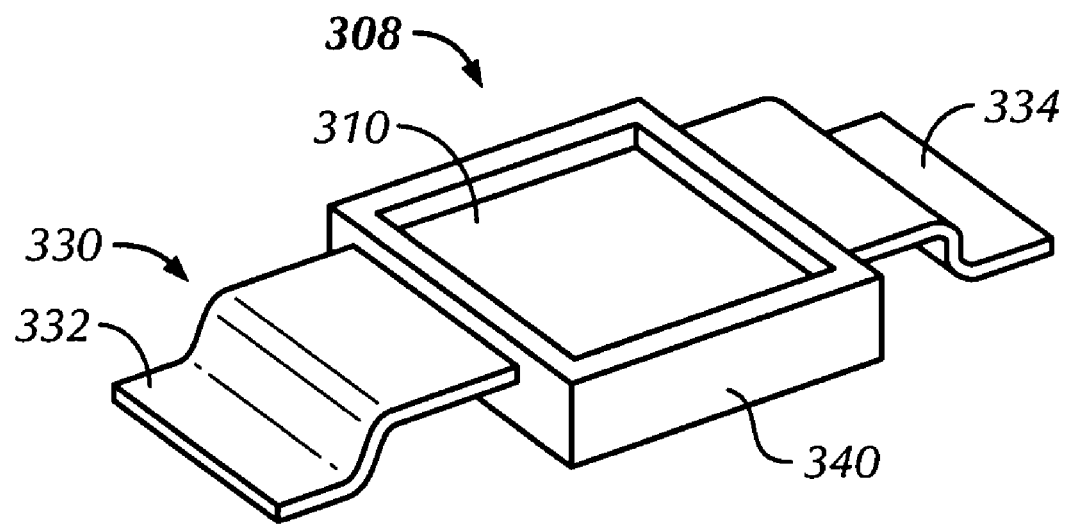
FIG. 5 shows an inverted view of a part of the indirect cooling system of FIG. 3.

FIG. 5 shows an inverted view of the lid 308 and the fluid system 330 in accordance with one or more embodiments of the present invention. The lid 308 includes an inner surface 310. When the lid 308 is mounted over the semiconductor device 302, the inner surface 310 of the lid 308 comes into contact with the TIM layer 306, and is thus thermally coupled to the semiconductor device 302. Furthermore, FIG. 5 shows a cavity of the lid 308 that encases the semiconductor device 302 between the lid 308 and the substrate 304.

The TIM layer 306 of the indirect cooling system 300 may be composed of any material known in the art. For example, the TIM layer 306 may be a thermal grease material. Thermal grease is typically silicone oil filled with aluminum oxide, zinc oxide, or boron nitride. In another embodiment, a pulverized silver may be used.

Alternatively, in one or more embodiments, the TIM layer 306 may be replaced by a layer of carbon nanotubes. As previously discussed, carbon nanotubes have a very high thermal conductivity compared to other known materials. Thus, a layer of carbon nanotubes may provide a very effective substitute for the TIM layer 306. In one or more embodiments of the present invention, first ends of a layer of carbon nanotubes may be attached to the semiconductor device 302, and second ends of the layer of carbon nanotubes may be attached to the lid 308. Accordingly, heat from the semiconductor device 302 may be conducted through the layer of carbon nanotubes to the lid 308. Such embodiments provide both direct and indirect cooling of the semiconductor device 302 by carbon nanotubes. Those skilled in the art will appreciate that carbon nanotubes may be disposed between the semiconductor device 302 and the lid 308 in any configuration desired.

Figure 6:
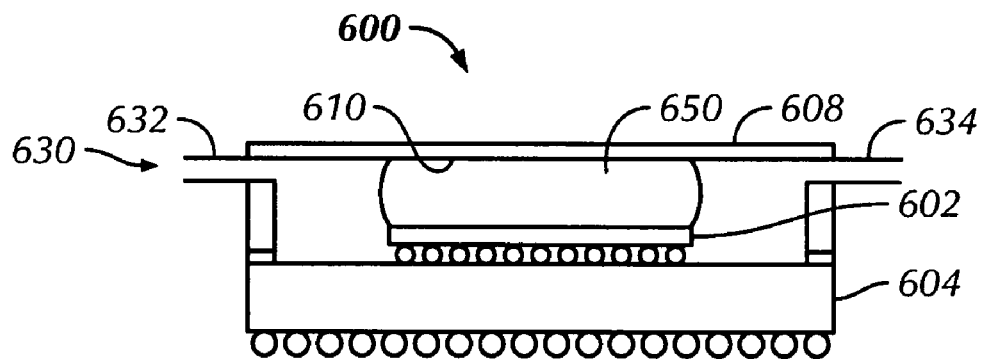
FIG. 6 shows a side view of a direct cooling system in accordance with one or more embodiments of the present invention.

FIG. 6 shows a side view of a direct cooling system 600 for cooling a semiconductor device 602 in accordance with one or more embodiments of the present invention. The direct cooling system 600 is similar to the cooling system 200 shown in FIG. 2. The semiconductor device 602 is mounted onto a substrate 604, which may be further mounted to a PCB. Furthermore, mounting to the substrate 604 or the PCB may also include electrically connecting the respective members.

A lid 608 is mounted over and encases the semiconductor device 602 between the lid 608 and the substrate 604. Furthermore, a plurality of carbon nanotubes 650 are disposed between the semiconductor device 602 and the lid 608. In the embodiment of FIG. 6, the carbon nanotubes 650 are in contact with the semiconductor device 602, extend toward an inner surface 610 of the lid 608, and, further, contact the inner surface 610 of the lid 608. However, those skilled in the art will appreciate that the carbon nanotubes 650 need not contact the inner surface 610 of the lid 608.

Additionally, the direct cooling system 600 includes a fluid system 630 configured to pass a fluid through the lid 608, thereby employing an active mechanism by which heat may be removed. As shown in FIG. 6, the fluid system 630 includes a first pipe 632 and a second pipe 634, each connected to and communicating with the lid 608. As discussed above, those skilled in the art will appreciate that the fluid system 630 may employ any mechanism known in the art by which the fluid system 630 is configured to pass the fluid through the lid 608. Furthermore, the fluid system 630 may employ any mechanism known in the art to facilitate flow of the fluid through the lid 608. For example, a pump may be connected between the first and second pipes 632, 634.

The fluid enters the lid 608, passing over and removing heat from surfaces of the semiconductor device 602, the lid 608, and/or the carbon nanotubes 650. Accordingly, the fluid and the carbon nanotubes 650 are configured to directly remove heat from the semiconductor device 602. Thus the direct cooling system 600 provides an aggressive system by which the semiconductor device 602 may be cooled.

In the direct cooling system 600, the lid 608 is mounted and sealed to the substrate 604 to prevent the fluid from leaking out of the lid 608. The seal between the lid 608 and the substrate 604 may be air-tight to ensure no fluid leaks out of the lid 608. For example, the lid 608 may be sealed to the substrate 604 by disposing a sealant at an interface of the lid 608 and the substrate 604. Furthermore, a portion of the semiconductor device 602 (e.g., the bottom) may also be sealed to the substrate 604 to prevent the fluid from contacting any exposed electrical connections.

The carbon nanotubes 650 may be disposed between the semiconductor device 602 and the lid 608 in any configuration desired. For example, the carbon nanotubes 650 may be formed as a plurality of fins contacting the semiconductor device 602, but not contacting the inner surface 610 of the lid 608. Accordingly, the fluid may cool the extended fins of the carbon nanotubes 650. Alternatively, the carbon nanotubes 650 may be formed as a plurality of microchannels, thus contacting both the semiconductor device 602 and the inner surface 610 of the lid 608. Accordingly, the fluid may pass through the microchannels of the carbon nanotubes 650, thus cooling the exposed surface area of the carbon nanotubes 650. In this example, the lid 608 is also effectively thermally coupled to the semiconductor device 602. In either case, the fluid and the carbon nanotubes 650 directly cool the semiconductor device 602.

Figure 7:
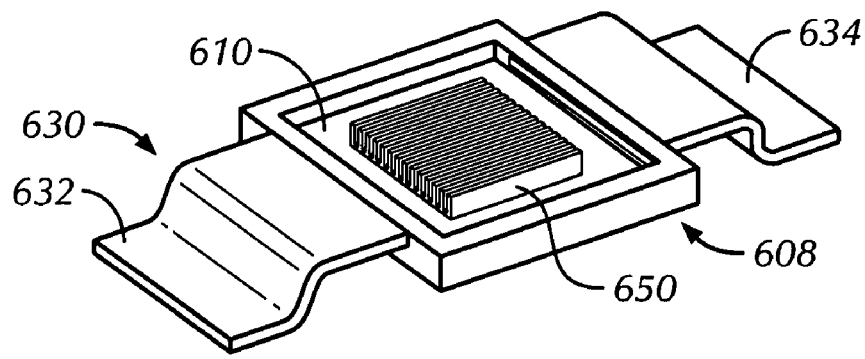
FIG. 7 shows an inverted view of a direct cooling system in accordance with one or more embodiments of the present invention.

FIG. 7 shows an inverted view of the lid 608 and the fluid system 630 in accordance with one or more embodiments of the present invention. In this embodiment, the lid 608 and the carbon nanotubes 650 disposed therein are manufactured separately from the semiconductor device 602. Specifically, manufacturing the carbon nanotubes 650 separately from the semiconductor device 602 may provide a simpler and more economically viable method of manufacture.

The carbon nanotubes 650 are disposed on the inner surface 610 of the lid 608 in any configuration desired. Furthermore, first ends of the carbon nanotubes 650 are connected to the inner surface 610 of the lid 608. The carbon nanotubes 650 are further disposed such that when the lid 608 is mounted over the semiconductor device 602, second ends of the carbon nanotubes 650 come into contact with a top surface of the semiconductor device 602. Accordingly, the carbon nanotubes 650 are configured to contact and conduct heat away from the semiconductor device 602 without the need to directly dispose or grow the carbon nanotubes 650 on the semiconductor device 602. Thus, any flaw in either the semiconductor device 602 or the carbon nanotubes 650 does not affect the usability of both the semiconductor device 602 and the carbon nanotubes 650.

Alternatively, in one or more embodiments of the invention, the lid 608 may be manufactured separately from both the semiconductor device 602 and the carbon nanotubes 650. Accordingly, the carbon nanotubes 650 may be disposed on the semiconductor device 602, wherein the first ends of the carbon nanotubes 650 contact the semiconductor device 602. Furthermore, the carbon nanotubes 650 may be disposed on the semiconductor device 602 such that when the lid 608 is mounted over the semiconductor device 602, the second ends of the carbon nanotubes 650 contact the inner surface 610 of the lid 608.

In one or more other embodiments of the invention, the lid 608 may also include a chamber, similar to the chamber 340 of the lid 308 shown in FIG. 3. Similarly, carbon nanotubes may also be disposed in the chamber of the lid 608 in any configuration desired, and the fluid system 630 may also be configured to pass the fluid through the chamber of the lid 608. Accordingly, the carbon nanotubes 650 disposed between the semiconductor device 602 and the lid 608 may conduct heat away from the semiconductor device 602 and into the lid 608. Then, the carbon nanotubes disposed in the chamber of the lid 608 and the lid 608 itself may be cooled by the fluid passing therethrough. Such embodiments may thus provide both direct and indirect cooling of the semiconductor device 602 by the fluid and carbon nanotubes. Essentially, any combination of the indirect cooling system 300 and the direct cooling system 600 may be used as a system for cooling a semiconductor device.

Figure 8:
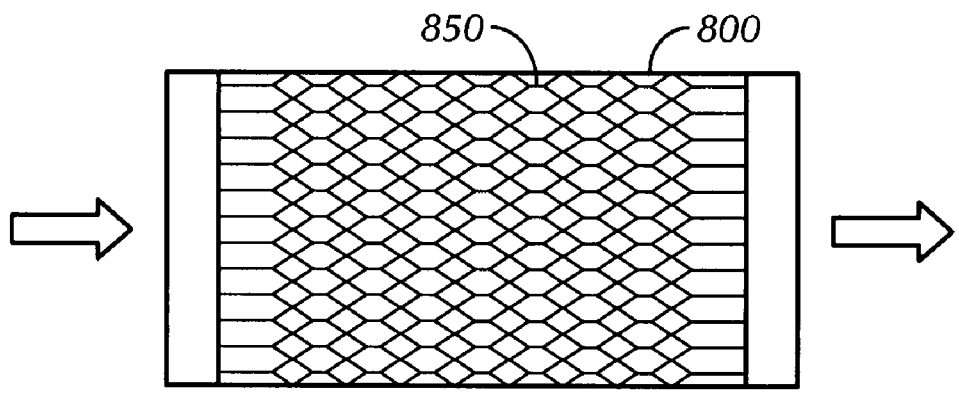
FIG. 8 shows a plan view of a surface having carbon nanotubes disposed thereon in accordance with one or more embodiments of the present invention.

FIG. 8 shows a plan view of a plurality of carbon nanotubes 850 disposed on a surface 800 in accordance with one or more embodiments of the present invention. The surface 800 may be similar, for example, to the bottom surface 342 of the chamber 340, the top surface 344 of the chamber 340, the inner surface 610 of the lid 608, or the semiconductor device 602, all of which may include carbon nanotubes in one or more embodiments of the present invention. The arrows in FIG. 8 show a direction of flow of a fluid passing over and/or through the carbon nanotubes 850.

Furthermore, FIG. 8 shows one exemplary configuration, i.e., a lattice structure, in which the carbon nanotubes 850 may be disposed. As previously discussed, the carbon nanotubes 850 may be disposed in any configuration desired. As such, microchannels or fins formed by the carbon nanotubes 850 may be formed to have any desired width, length or geometrical configuration.

Additionally, the carbon nanotubes 850 may be disposed in any location on the surface 800. For example, the carbon nanotubes may only be disposed in locations corresponding to hot spots on a semiconductor device. Such a placement of the carbon nanotubes 850 may provide a more efficient or economically viable system. Furthermore, the carbon nanotubes 850 may be disposed or grown on the surface 850 in any way known in the art.

Embodiments of the present invention may provide one or more of the following advantages. Active indirect cooling systems and active direct cooling systems utilizing carbon nanotubes may provide a desired thermal management solution to a wide range of thermal dissipation applications. Carbon nanotubes have a very high thermal conductivity relative to other known materials, and may also provide geometrical flexibility and mechanical rigidity. Thus, carbon nanotubes are especially able to conduct heat away from a semiconductor device in a desired manner.

Additionally, the carbon nanotubes may be formed into any configuration desired. Forming carbon nanotubes into microchannels or fins may provide a great amount of heat exchange surface area. Further, through the use of existing carbon nanotube growth technology, a desired configuration of the microchannels may be formed with fine control.

Moreover, in embodiments of the present invention, the carbon nanotubes may be manufactured separately from the semiconductor device. That is, the carbon nanotubes may be disposed or grown within a lid, separate from a semiconductor device, which may later be brought into contact with the semiconductor device. Thus, embodiments of the present invention may provide reliable and manufacturable solutions for cooling a semiconductor device. Also, embodiments of the invention allow a fluid of choice to be used for cooling the system.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for cooling a semiconductor device, comprising:
   a lid encasing the semiconductor device;
   a first plurality of carbon nanotubes disposed within the lid; and
   a fluid system configured to pass a fluid through the lid.

2. The system of claim 1, wherein the first plurality of carbon nanotubes form a plurality of microchannels.

3. The system of claim 2, wherein the fluid system is further configured to pass the fluid through the microchannels.

4. The system of claim 1, wherein the first plurality of carbon nanotubes are disposed in a chamber between a top surface of the chamber and a bottom surface of the chamber.

5. The system of claim 4, wherein first ends of the first plurality of carbon nanotubes contact the bottom surface of the chamber, and second ends of the first plurality of carbon nanotubes contact the top surface of the chamber.

6. The system of claim 4, further comprising a thermal interface material layer disposed between an inner surface of the lid and a top surface of the semiconductor device.

7. The system of claim 4, further comprising a second plurality of carbon nanotubes disposed between an inner surface of the lid and a top surface of the semiconductor device.

8. The system of claim 1, wherein the first plurality of carbon nanotubes are disposed between an inner surface of the lid and a top surface of the semiconductor device.

9. The system of claim 8, wherein first ends of the carbon nanotubes are in contact with the inner surface of the lid, and second ends of the carbon nanotubes are in contact with the top surface of the semiconductor device.

10. The system of claim 8, further comprising a second plurality of carbon nanotubes disposed in a chamber between a top surface of the chamber and a bottom surface of the chamber.

11. The system of claim 1, further comprising:
    a heat sink; and
    a heat sink thermal interface material layer disposed between the lid and the heat sink.

12. The system of claim 1, wherein the fluid system comprises:
    a first pipe connected to the lid; and
    a second pipe connected to the lid,
    wherein the fluid flows into the lid through the first pipe, and the fluid flows out of the lid through the second pipe.

13. The system of claim 1, wherein the fluid system further comprises a pump, wherein the pump pumps fluid through the lid.

14. A system for cooling a semiconductor device, comprising:
    a lid;
    a first plurality of carbon nanotubes disposed within the lid; and
    a fluid system configured to pass a fluid through the lid,
    wherein the lid is configured to be mounted over and encase the semiconductor device.

15. The system of claim 14, wherein the first plurality of carbon nanotubes form a plurality of microchannels.

16. The system of claim 15, wherein the fluid system is further configured to pass the fluid through the microchannels.

17. The system of claim 14, wherein first ends of the first plurality of carbon nanotubes contact an inner surface of the lid, and when the lid is mounted over the semiconductor device, second ends of the first plurality of carbon nanotubes contact the semiconductor device.

18. The system of claim 14, further comprising a second plurality of carbon nanotubes disposed in a chamber between a top surface of the chamber and a bottom surface of the chamber.

19. A method for cooling a semiconductor device, comprising:
 disposing a first plurality of carbon nanotubes within a lid;
 mounting the lid, having the first plurality of carbon nanotubes disposed therein, over the semiconductor device; and
 passing a fluid through the lid mounted over the semiconductor device.

20. The method of claim 19, wherein the first plurality of carbon nanotubes form a plurality of microchannels, and wherein the fluid passes through the microchannels.

21. The method of claim 19, wherein the first plurality of carbon nanotubes are disposed in a chamber between a top surface of the chamber and a bottom surface of the chamber.

22. The method of claim 19, wherein the first plurality of carbon nanotubes are disposed between an inner surface of the lid and a top surface of the semiconductor device.

23. The method of claim 21, further comprising disposing a second plurality of carbon nanotubes within the lid, wherein the second plurality of carbon nanotubes are disposed between an inner surface of the lid and a top surface of the semiconductor device.

24. The method of claim 22, further comprising disposing a second plurality of carbon nanotubes within the lid, wherein the second plurality of carbon nanotubes are disposed in a chamber between a top surface of the chamber and the bottom surface of the chamber.

* * * * *